US006789220B1

(12) United States Patent
Lovejoy

(10) Patent No.: US 6,789,220 B1
(45) Date of Patent: Sep. 7, 2004

(54) METHOD AND APPARATUS FOR VECTOR PROCESSING

(75) Inventor: Michael L. Lovejoy, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 563 days.

(21) Appl. No.: 09/849,859

(22) Filed: May 3, 2001

(51) Int. Cl.[7] ............... G01R 31/3177; G01R 31/3187
(52) U.S. Cl. .................. 714/733; 714/728; 714/732; 714/736; 714/738; 714/739
(58) Field of Search ................. 714/728, 732–733, 714/736, 738–739

(56) References Cited

U.S. PATENT DOCUMENTS

| | | | | |
|---|---|---|---|---|
| 5,301,199 | A | * 4/1994 | Ikenaga et al. | 714/733 |
| 5,570,375 | A | 10/1996 | Tsai et al. | |
| 6,199,184 | B1 | * 3/2001 | Sim | 714/732 |
| 6,463,561 | B1 | * 10/2002 | Bhawmik et al. | 714/733 |
| 2002/0120896 | A1 | * 8/2002 | Wang et al. | 714/731 |
| 2002/0124217 | A1 | * 9/2002 | Hiraide et al. | 714/738 |
| 2002/0170009 | A1 | * 11/2002 | Barnhart | 714/726 |
| 2003/0120988 | A1 | * 6/2003 | Rajski et al. | 714/726 |

FOREIGN PATENT DOCUMENTS

JP        63286780 A   * 11/1988  .......... G01R/31/28

OTHER PUBLICATIONS

Digital Non Integer Frequency Divider, IBM Technical Disclosure Bulletin, May 1978, vol. 20, Issue 12, p. 5214.*
Agrawal et al, "A Tutorial on Built–In Self–Test", Part 1: Principles, IEEE, 1993, pp. 73–82.
Agrawal et al., "A Tutorial on Built–In Self–Test—Part 2: Applications", IEEE Journal of Design and Test of Computers, Jun. 1993, pp 69–77.

* cited by examiner

*Primary Examiner*—R. Stephen Dildine
(74) *Attorney, Agent, or Firm*—W. Eric Webostad; Edel M. Young; Justin Liu

(57) ABSTRACT

A method and apparatus for test vector compression is described. More particularly, a response analyzer is described having a shift register and a multiple-input signature register. The shift register is used to perform a first vector space reduction, and the MISR is used to perform a second vector space compression. Accordingly the MISR may be scaled down in input width by a reduction factor of the shift register.

21 Claims, 3 Drawing Sheets

METHOD AND APPARATUS FOR VECTOR PROCESSING

FIELD OF THE INVENTION

The present invention generally relates to test vectors, and more particularly to built-in self-test response analysis using two dimension vector space.

BACKGROUND OF THE INVENTION

In order to test complex integrated circuits, test circuits are added to the integrated circuit. The concept of adding circuits to a circuit for purposes of testing is known as "built-in self-test" or BIST.

In part BIST circuits may provide built-in access to circuits that would not otherwise be available on a bare or packaged die. In part BIST circuits may provide signals closer to actual operational signals than comparable automatic test equipment. In part BIST circuits may facilitate bypassing test steps using such automatic test equipment thereby reducing the need to purchase such automatic test equipment. In part BIST circuits may facilitate a hierarchical test strategy for more efficiently diagnosing problems. In any event, BIST circuits are added to an integrated circuit and thus consume semiconductor die area in addition to that consumed by the application circuitry.

Conventionally, BIST circuits added to an integrated circuit comprise a test pattern generator (such a read-only-memory with stored patterns, a counter, exclusive-OR (XOR) circuit trees, a linear feedback shift register (LFSR), and the like), a response analyzer (such as a comparator with store responses, an LFSR, and the like), and a control block (such as a test manager or test controller circuit configured to activate a test and process responses from the response analyzer). A test vector is generated by a test pattern generator and provided to an application circuit of the integrated circuit. A test vector output is provided from the application circuit in response to the test vector input. Thus, an input test vector corresponding to a specific address, and an output test vector represents test data associated with a response of the application circuit to the input test vector. This test vector output is provided to a response analyzer for providing an output indicating whether the application circuit functioned as intended.

In "A Tutorial on Built-In Self-Test—Part 2: Applications" by Vishwani D. Agrawal, Charles R. Kime and Kewal K. Saluja in IEEE Journal of Design and Test of Computers, June 1993, pages 69–77, several configurations of BIST circuitry are disclosed divided into two groups, namely, test-per-clock and test-per-scan. In a test-per-clock configuration, for each clock period a test vector is applied and a test vector output is obtained in response to the test vector applied. In a test-per-scan configuration, a scan capability is used to apply a test vector and capture a response thereto each scan cycle, where a scan cycle is a number of clock cycles needed for shifting a vector into a serial scan path or to shift a response to such a vector out of such a serial scan path. In a test-per-clock period configuration using a multiple-input signature register or MISR (pronounced "miser") for a response analyzer, it is stated that XORs are needed on each output stage in addition to LFSR hardware. In one test-per-scan configuration using a MISR, a scan register output is used to drive a MISR on only a portion of outputs from a circuit under test (CUT), where remaining outputs are shifted from a scan register to such a MISR on each clock cycle. In another test-per-scan configuration known as STUMPS or "self-test using an MISR and parallel shift register sequence generator," a MISR receives outputs from serial scan paths in parallel.

Heretofore, response analyzers have been at least equal, if not greater, in vector length or input width to their test pattern generator counter parts. For example, a MISR used for a response analyzer would be at least equal in input width to an LFSR used for generating an input vector. To reduce die area consumption, a MISR was integrated with an application circuit data shift register. By reuse of a data shift register as a test vector shift register, as opposed to using independent shift registers for data and test vector shifting, semiconductor die area consumption was reduced. Integration conventionally doubled shift register area consumption; however, using independent shift registers for data and test vectors would consume more area than an integrated configuration. In such integrated MISR and data shift register systems, a one-dimensional vector space is used for compression. In operational terms, each compression step is performed on a vector column-by-column basis in the MISR and then a compressed vector is outputted via the data shift register.

Accordingly, it would be desirable to provide a response analyzer that consumes less semiconductor die area than those of the past.

SUMMARY OF THE INVENTION

An aspect of the present invention is a response analyzer. More particularly, a shift register is configured to receive a plurality of inputs representing test data and to provide a plurality of outputs fewer in number than the plurality of inputs. A multiple-input signature register is configured to receive the plurality of outputs and to compress the plurality of outputs to an output.

Another aspect of the present invention is a method for compression of a vector. More particularly, a shift register is provided. A multiple-input signature register is coupled to the shift register. Bits of the vector are shifted out with the shift register to provide an output width less than the vector length. The bits are shifted out to the multiple-input signature register. The vector is compressed with the multiple-input signature register to produce an output.

Another aspect of the present invention is a response analyzer having a first stage configured to receive an input test vector and to provide said input test vector a portion at a time, wherein said portion is narrower in bit input width than said input test vector length, and having a second stage configured to receive each said portion and to compress said input test vector to provide an output.

Another aspect of the present invention is a response analyzer for built-in self-test circuitry. More particularly, a first shift register is configured to receive each test data vector of a plurality of test data vectors and to output each said test data vector a portion at a time, wherein said portion has fewer bits in input width than each said test data vector length. A second shift register is configured to receive each said portion and to compress each said test data vector. The second shift register is configured with feedback.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE DRAWINGS

The present invention is described in terms of a BIST implementation; however, it will be apparent to those of skill in the art that other implementations may be used in accordance with the teachings of the present invention.

Figure 1:
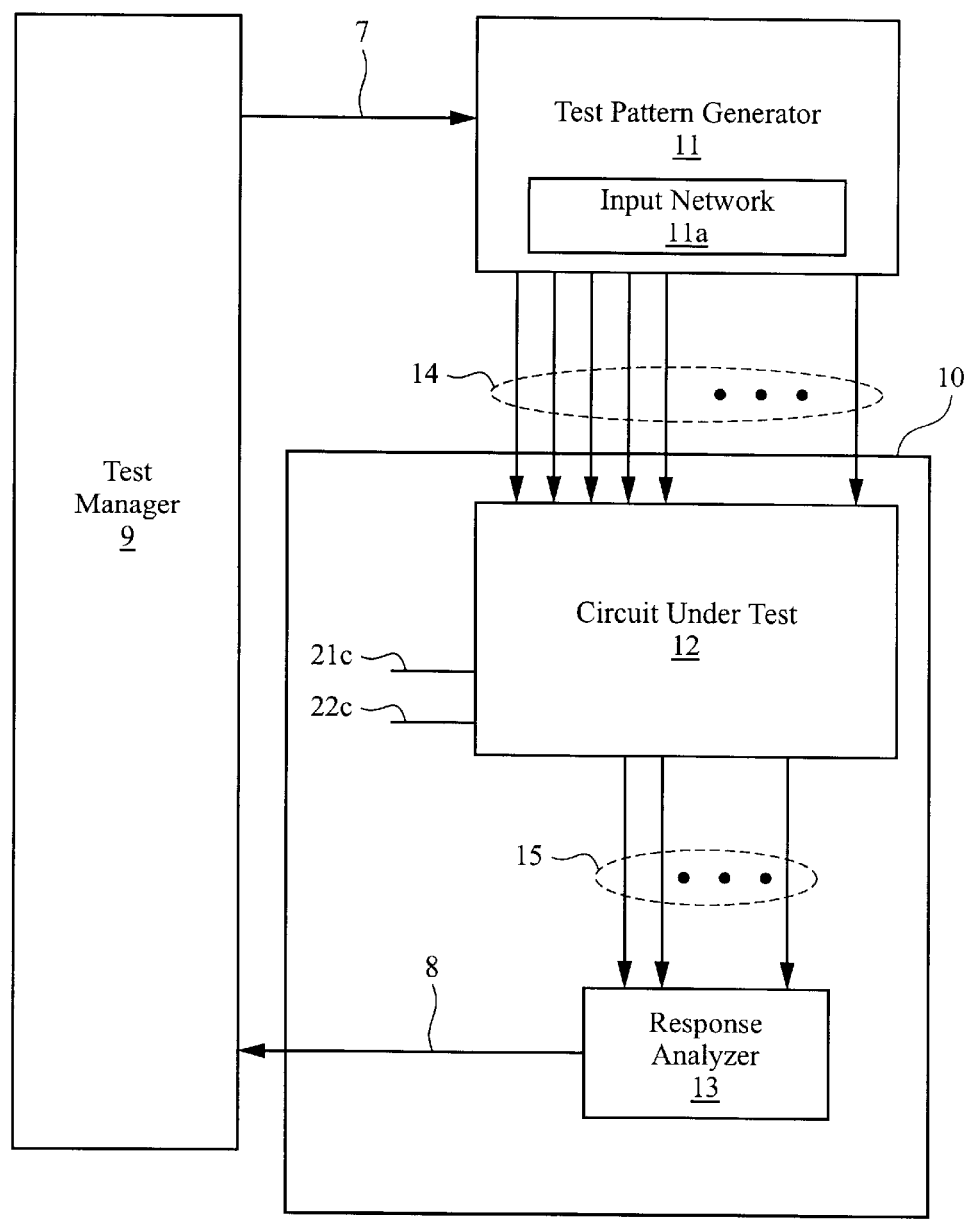
FIG. 1 is a block diagram of an exemplary portion of an integrated circuit coupled to BIST circuitry in accordance with an aspect of the present invention.

FIG. 1 is a block diagram of an exemplary portion of an integrated circuit 10 coupled to BIST circuitry in accordance with an aspect of the present invention. Integrated circuit 10 comprises application circuitry, a portion of which is illustratively shown as a circuit under test (CUT) 12. Integrated circuit 10 may be a microprocessor, a code engine, a microcontroller, an application specific integrated circuit, a field programmable gate array, a complex programmable logic device, among other well-known types of integrated circuits suitable for BIST.

Integrated circuit 10 comprises response analyzer 13 and is coupled to BIST circuitry comprising test manager or test controller circuitry 9 and test pattern generator 11. Test manager 9 provides an indicator 7 to test pattern generator 11 to provide a test pattern such as an input test vector or a plurality of test vectors 14 to CUT 12. Notably, a plurality of test vectors of a test pattern are conventionally referred to as a set of test vectors owing to this relationship. In response to receiving an input test vector or a set of input test vectors 14, CUT 12 provides an output test vector or a set of output test vectors 15, respectively. This response 15 is provided to response analyzer 13.

Response analyzer 13 compresses output test vector or vectors 15 to provide an indicator 8 to test manager 9 indicating results of a test of CUT 12 using input vector or vectors 14 as a stimulus. As all elements of circuit 10, other than response analyzer 13 in accordance with the present invention, are well known, unnecessary details regarding them have been avoided for purposes of clarity.

Figure 2:
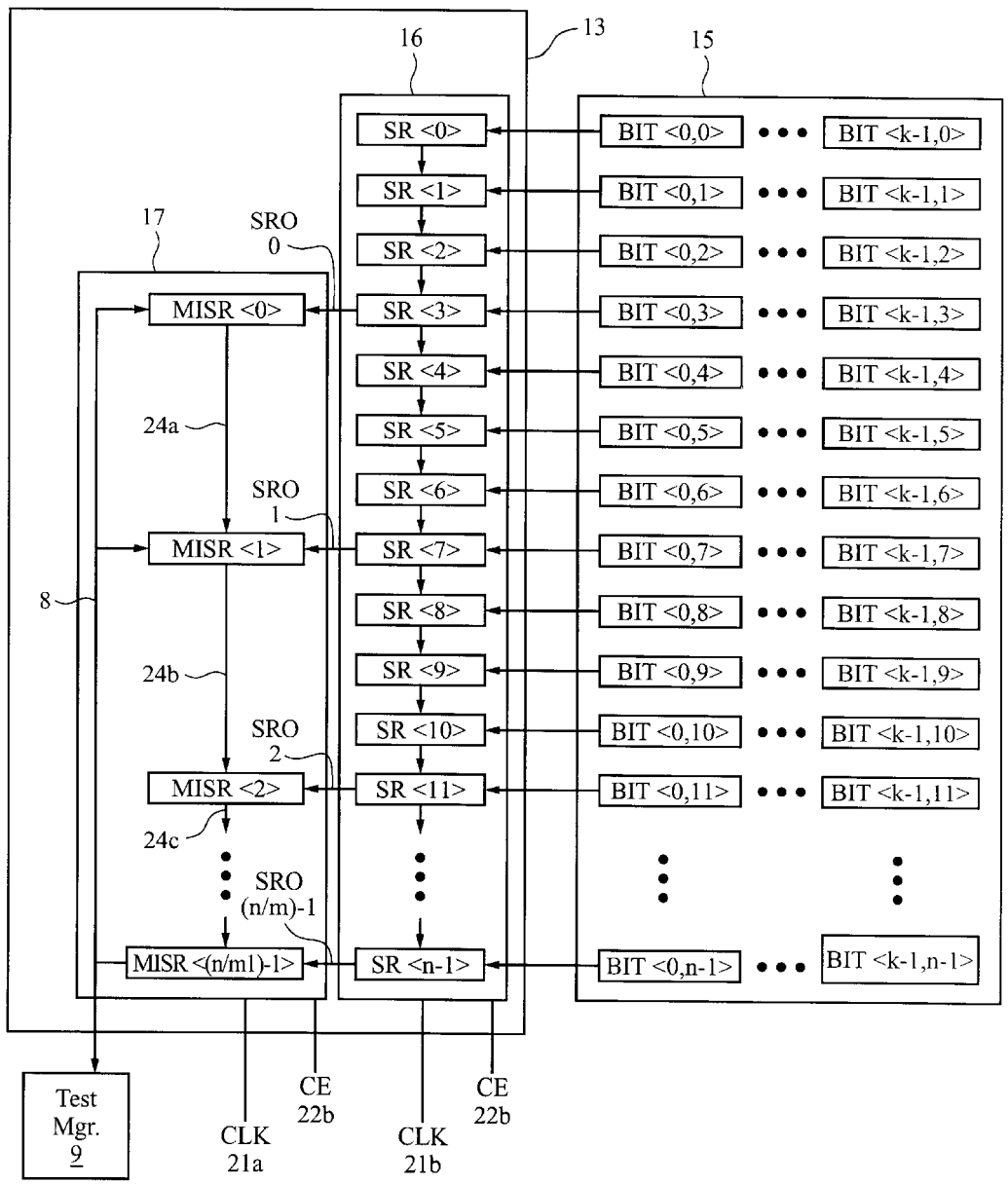
FIG. 2 is a block diagram of an exemplary portion of a response analyzer having MISR circuitry in accordance with an aspect of the present invention.

FIG. 2 is a block diagram of an exemplary portion of a response analyzer 13 in accordance with an aspect of the present invention. Response analyzer 13 comprises MISR 17 and scan register 16. MISR 17 is illustratively shown; however, other configurations of shift registers with feedback may be used. Scan register 16 may be implemented as a shift register, as illustratively shown here. It should be appreciated that shift register 16 is may or may not be an integrated version of a data shift register and a vector shift register. Shift register 16 is used in part for vector length reduction, and MISR 17 compresses input from shift register 16. Thus, a two-dimensional vector space, as explained below in more detail, is used for processing test data output vectors 15.

Output test vectors 15 are illustratively shown as a set of k vectors n bits long. Accordingly, for a vector or a set of vectors 15, k is an integer equal to or greater than one and n is an integer equal to or greater than 2. Though a single two-bit long vector could be processed, it would hardly justify use of MISR 17. More common examples would be two or more vectors of length equal to or greater than 8 bits. For purposes of clarity of explanation, it is assumed that test output vectors 15 provide a set of four vectors, each of which is 16 bits in length. Hence, in the array of vectors shown in FIG. 2, k is equal to 4, and n is equal to 16.

A first stage reduction in vector space is done with shift register 16. In other words, shift register receives an n-bit wide input in parallel and provides m1 one bit outputs in parallel or an n/m1 bit wide output, where m1 is a first stage reduction factor and m1 is an integer greater than one and less than n. More particularly, n may be evenly divisible by m1. Thus, shift register 16 provides outputs SRO 0 to SRO (n/m1)−1 as inputs to MISR 17.

Each of these 16 bits are provided in parallel to shift register 16. For example, bits <0,0>, <0,1>, <0,2>, and <0,3> are inputted or loaded to shift register elements, such as flip-flops and the like, SR<0>, SR<1>, SR<2>, and SR<3>, respectively. SR<0> output is provided or down-shifted to SR<1>. SR<1> output is provided to SR<2>. SR<2> output is provided to SR<3>. SR<3> output is provided to SR<4> and to MISR 17 as scan register output (SRO) 0. SR<n> bit may be used as a controlling latch for MISR 17.

Clock signal 21c and clock enable signal 22c (shown in FIG. 1) are used to clock a first vector of k vector(s) into shift register 16. Clock signal 21b and clock enable signal 22b are used to clock bits from shift register 16 within shift register 16 and to MISR 17. So, for example, on a first clock pulse of clock signal 21b while shift register 16 is enabled for clocking, loaded bit <0,0> is shifted from SR<0> to SR<1>, loaded bit <0,1> is shifted from SR<1> to SR<2>, loaded bit <0,2> is shifted from SR<2> to SR<3>, and loaded bit <0,3> is shifted from SR<3> to SR<4> and to MISR<0>. Shifting of bits from SR<3> to SR<4> in this example is optional, as such bits are not used. On a second clock pulse, loaded bit <0,0> is shifted from SR<1> to SR<2>, loaded bit <0,1> is shifted from SR<2> to SR<3>, and loaded bit <0,2> is shifted from SR<3> to MISR<0>. On a third clock pulse, loaded bit <0,0> is shifted from SR<2> to SR<3>, and loaded bit <0,1> is shifted from SR<3> to MISR<0>. On a fourth clock pulse, loaded bit <0,0> is shifted from SR<3> to MISR<0>. In between each shift of shift register 16, a MISR 17 compression operation, as described below, is executed.

A second stage reduction in vector space is done in MISR 17. MISR 17 receives n/m1 inputs and provides a single output 8. Thus, MISR 17 has an n/m1 to 1 compression ratio. In other words, MISR 17 has a compression factor m2, where m2=n/m1 for m2 an integer greater than one and less than n and may be equal to, greater than or less than m1.

While shift register 16 is active, MISR 17 is active for receiving and processing shifted input bits. Clock signal 21a and clock enable signal 22a are used to clock in such bits to MISR 17. Continuing the above example for bits <0,0> through <0,3>, bit <0,3> is clocked to MISR<0> of MISR 17 on a first clock pulse of clock signal 21a while MISR 17 is enabled for clocking. Bit <0,2> is clocked to MISR<0> on a second clock pulse; bit <0,1> is clocked to MISR<0> on a third clock pulse, and bit <0,0> is clocked to MISR<0> on a fourth clock pulse.

Accordingly, SRO 0 to SRO [(n/m1)−1] are provided, or more particularly forward-shifted, to MISR<0> to MISR<(n/m1)−1>, respectively. SRO 0 and feedback 8 are provided to MISR<0> as illustratively shown in more detail in FIG. 3. Notably, not all MISR<x> elements receive feedback 8. Feedback is chosen to reduce masking errors, such as two errors in a row appearing correct, and is conventionally selected using circuit simulation as it is implementation specific. Moreover, feedback 8 need not be equivalent to output 8. For example, output 8 and feedback 8 may be complementary signals. However, for purposes of clarity, feedback 8 and output 8 are described as the same signal. Output 24a of MISR<0> is provided, or more particularly forward-shifted, to MISR <1>; output 24b of MISR<1> is provided to MISR<2>; output 24c of MISR<2> is provide to a MISR<y>; and so on until reaching MISR<(n/m)−1>.

MISR<(n/m)−1> is used to provide output 8. Output 8 may be a result from compression of a single vector or a plurality of vectors, such as a set of vectors 15. For example, after processing all bits from k vectors through shift register 16, MISR 17 has received all bits of test pattern 15. Thus, a resultant vector is stored in MISR 17, which may be clocked out of MISR 17 using clock signal 21a. For example, if MISR 17 had MISR<0> to MISR<3>, then there would be a 4-bit resultant vector stored in MISR 17 of which each bit may be serially clocked out. Alternatively, taps to each output of each MISR<y> may be provided for parallel output.

It should be appreciated that a MISR in accordance with an aspect of the present invention may be reduced in size with respect to comparable prior art MISRs by a factor of approximately m1 owing to a reduction in input width. Actual die area savings are dependent on implementation. However, it has been estimated that a MISR with an integrated data/test vector shift register in accordance with an aspect of the present invention would occupy approximately 60 to 70 percent of the space of a comparable prior art MISR, and it has been estimated that a MISR and a separate test vector shift register combination in accordance with an aspect of the present invention would occupy approximately 70 to 80 percent of a comparable prior art combination.

Figure 3:
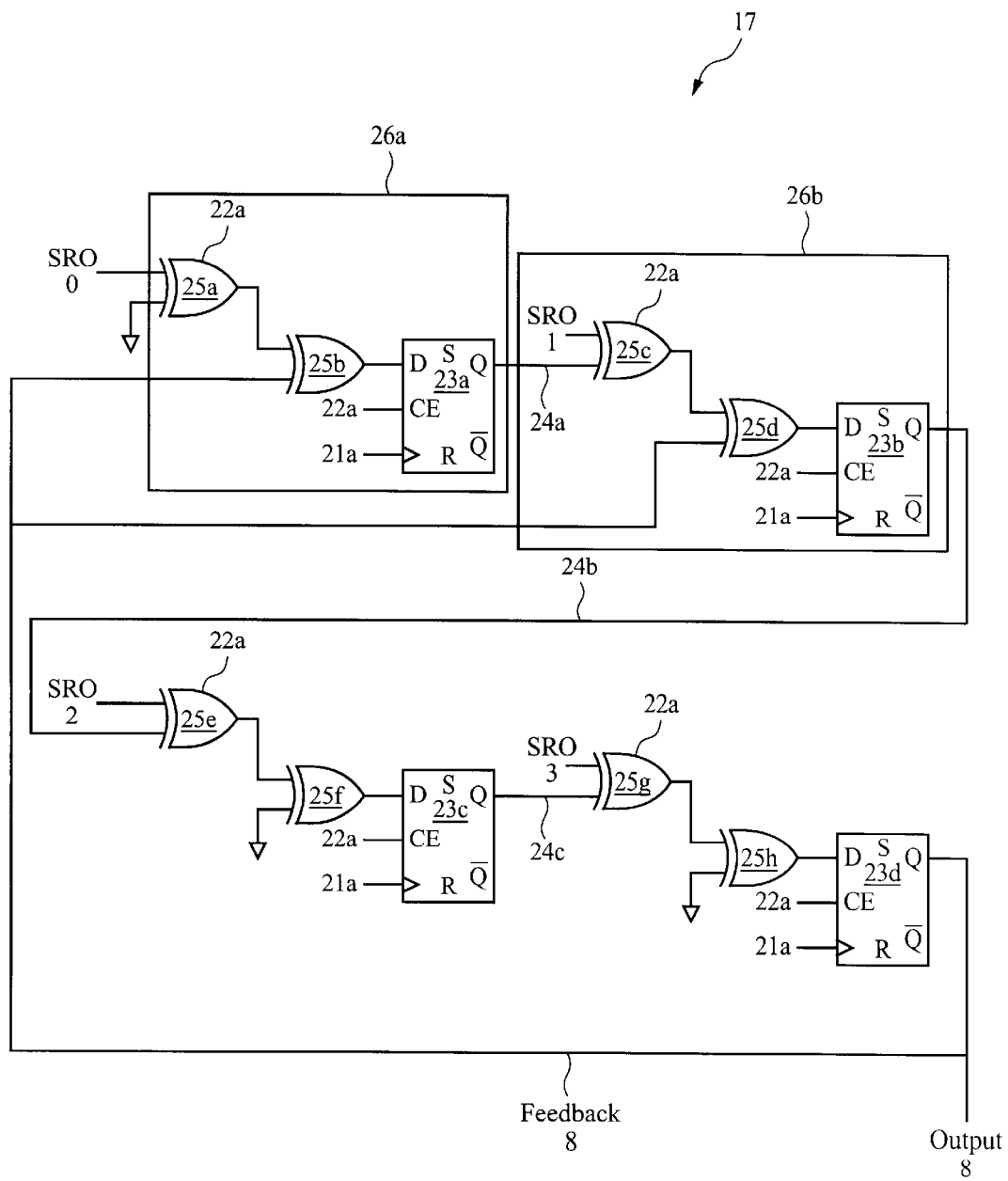
FIG. 3 is a schematic diagram of an exemplary portion of an embodiment of a MISR configured for receiving outputs from a shift register in accordance with an aspect of the present invention.

FIG. 3 is a schematic diagram of an exemplary portion of an embodiment of an MISR 17 configured for receiving SRO 0 through SRO 3 in accordance with an aspect of the present invention. SRO 0 is provided to XOR 25a. XOR 25a has one of its inputs tied to ground, which is equally true for XORs 25f and 25h. Accordingly, it should be appreciated that a plurality of XORs 25 are shown, as it is conventional practice to make all such gates the same. However, XORs 25a, 25f and 25h may be replaced with buffers. Moreover, XOR 25a may be omitted. XORs 25a through 25h are shown as internal-XORs, though external-XORs may be used. Moreover, though MISRs are conventionally implemented with XORs and delay-type (D-type) flip-flops, such as flip-flops 23a through 23d, other types of circuit elements may be used as is known.

Clock enable signal 22a may be applied for putting XORs 25 in and out of an active mode. A bit, for example bit <0,0>, is clocked into and then latched at an MISR element 26, for example by MISR<0>. On a next clock pulse, a next bit, for example <0,1>, is latched by an MISR element 26, for example by MISR<0>, and a previously latched bit, for example bit <0,0>, having been processed through XOR gates, for example XOR gates 25a and 25b, is outputted by a D-type flip-flop, such as D-type flip-flop 23a, as an output to another MISR element 26, such as output 24a to MISR element 26b.

While foregoing is directed to the preferred embodiment of the present invention, other and further embodiments of the invention may be devised without departing from the basic scope thereof, and the scope thereof is determined by the claims that follow.

What is claimed is:

1. In an integrated circuit configured to receive a test pattern from a test pattern generator and to provide test data in response to the test pattern, a response analyzer comprising:
    a shift register configured to receive a plurality of inputs representing the test data and to provide a plurality of outputs fewer in number than the plurality of inputs; and
    a multiple-input signature register configured to receive the plurality of outputs and to compress the plurality of outputs.

2. The response analyzer of claim 1 wherein the shift register reduces the plurality of inputs to the plurality of outputs by a factor m1, an integer greater than 1.

3. The response analyzer of claim 2 wherein the multiple-input signature register compresses the plurality of outputs by a factor m2, an integer greater than 1.

4. The response analyzer of claim 3 wherein the factor m1 is equal to the factor m2.

5. The response analyzer of claim 3 wherein the factor m1 is less than the factor m2.

6. The response analyzer of claim 3 wherein the factor m1 is greater than the factor m2.

7. A method for compression of a vector, comprising:
    providing a shift register;
    providing a multiple-input signature register coupled to the shift register;
    shifting out bits of the vector with the shift register to provide an output with a bit output width less than a bit length of the vector;
    providing the shifted out bits to the multiple-input signature register; and
    compressing the vector with the multiple-input signature register to produce an output.

8. The method of claim 7 wherein the shift register and the multiple-input signature register in combination provide a response analyzer for a portion of built-in self-test circuitry.

9. The method of claim 7 further comprising repeating the shifting out bits step.

10. The method of claim 9 wherein the compressing the vector is done between the shifting out bits steps.

11. A method for compression of a set of vectors, comprising:
    providing a shift register;
    providing a multiple-input signature register coupled to the shift register, the multiple-input signature register input width narrower than input width of the shift register;
    shifting out bits for each vector of the set of vectors with the shift register;
    providing the shifted out bits to the multiple-input signature register; and
    compressing the set of vectors to produce an output vector having an output length corresponding to the input width of the multiple-input signature register.

12. The method of claim 11 wherein the shift register and the multiple-input signature register in combination provide a response analyzer for a portion of built-in self-test circuitry.

13. A response analyzer for built-in self-test circuitry, comprising:
    a first stage configured to receive an input test vector and to provide said input test vector a portion at a time, wherein said portion is narrower in bit width than said input test vector length; and
    a second stage configured to receive each said portion and to compress said input test vector to provide an output.

14. The response analyzer of claim 13 wherein said first stage is a shift register.

15. The response analyzer of claim 13 wherein said second stage is a multiple-input signature register.

16. A response analyzer for built-in self-test circuitry, comprising:
    a first shift register configured to receive each test data vector of a plurality of test data vectors and to output each said test data vector a portion at a time, wherein said portion has fewer bits in output width than each said test data vector length; and
    a second shift register configured to receive each said portion and to compress each said test data vector, said second shift register configured with feedback.

17. The response analyzer of claim 16 wherein said second shift register is configured as a multiple-input signature register.

18. The response analyzer of claim 17 wherein each said test data vector is provided in parallel to said first shift register.

19. The response analyzer of claim 18 wherein each output of each said test data vector from said shift register is provided in parallel to said second shift register.

20. The response analyzer of claim 19 wherein said second shift register compresses each said test data vector to provide a one-bit wide output.

21. The response analyzer of claim 19 wherein said second shift register serially shifts out a compression of the plurality of test data vectors.

* * * * *